United States Patent [19]

Labaar

[11] 4,453,139

[45] Jun. 5, 1984

[54] FREQUENCY OFFSET MULTIPLE CAVITY POWER COMBINER

[75] Inventor: Frederik Labaar, Long Beach, Calif.

[73] Assignee: Ford Aerospace & Communications Corporation, Detroit, Mich.

[21] Appl. No.: 320,981

[22] Filed: Nov. 12, 1981

[51] Int. Cl.$^3$ .......................... H03B 7/14; H03B 9/14
[52] U.S. Cl. ........................ 331/47; 330/56; 331/55; 331/56; 331/107 P
[58] Field of Search .................. 331/47, 55, 56, 48, 331/96, 102, 107 P, 117 D; 330/286, 287, 55, 56

[56] References Cited

U.S. PATENT DOCUMENTS

| | | | |
|---|---|---|---|
| 3,378,789 | 4/1968 | Gerlach | 331/107 |
| 3,582,813 | 6/1971 | Hines | 331/56 |
| 3,628,171 | 12/1971 | Kurokawa et al. | 331/56 |
| 3,662,285 | 5/1972 | Rucker | 331/107 R |
| 3,733,560 | 5/1973 | Oltman, Jr. et al. | 330/34 |
| 3,783,401 | 1/1974 | Oltman, Jr. | 330/56 |
| 3,873,934 | 3/1975 | Oltman, Jr. et al. | 330/56 |
| 3,931,587 | 1/1976 | Harp et al. | 331/56 |
| 3,943,463 | 3/1976 | Kuno et al. | 331/107 R |
| 3,962,654 | 6/1976 | Corrons et al. | 331/56 |
| 4,034,314 | 7/1977 | Dydyk | 331/101 |
| 4,075,578 | 2/1978 | Dydyk | 331/56 |
| 4,083,016 | 4/1978 | Zangrando et al. | 331/56 |
| 4,090,152 | 5/1978 | Dydyk | 331/102 |
| 4,097,817 | 6/1978 | Thoren et al. | 331/56 |
| 4,121,174 | 10/1978 | Aston | 331/48 |
| 4,143,334 | 3/1979 | Dydyk | 331/56 |
| 4,147,994 | 4/1979 | Thoren et al. | 331/56 |
| 4,172,240 | 10/1979 | Jerinic | 331/56 |
| 4,175,257 | 11/1979 | Smith et al. | 330/287 |
| 4,188,590 | 2/1980 | Harp et al. | 331/56 |
| 4,189,684 | 2/1980 | Hieber et al. | 331/56 |

OTHER PUBLICATIONS

"Proposal No. P-26189 GaAs IMPATT Diode Power Combining Techniques", vol. 1 Technical, Jan. 15, 1980, pp. 2-45 to 2-47, Ford Aerospace & Communications Corp., Newport Beach, California.

Primary Examiner—Siegfried H. Grimm
Attorney, Agent, or Firm—Edward J. Radlo; Robert D. Sanborn

[57] ABSTRACT

A combiner for power combining electromagnetic energy is disclosed. At least two electromagnetic cavities are positioned having intercavity coupling among all cavities: each cavity is tangent to all other cavities and/or external transmission line connections are employed to enhance/provide intercavity coupling. Each cavity contains within it at least one power generating device. An input/output port is connected via a nonreciprocal device to an output load and an injecting oscillator which usually has a lower power level than that of the free-running combiner and a higher spectral purity. The cavities are intentionally tuned to at least two different frequencies. For the two cavity and three cavity embodiments, a greater bandwidth is obtained compared with prior art combiners where the cavities are tuned to the same frequency. The power loss is slight. Derived formulas, based upon the injection locking ratio and the mutual injection locking ratio between cavities, are given for the maximum frequency separation between resonant frequencies of the cavities subject to the free-running single frequency condition, and for the maximum injection locking bandwidth of the frequency offset multiple cavity power combiner.

11 Claims, 9 Drawing Figures

FREQUENCY OFFSET MULTIPLE CAVITY POWER COMBINER

BACKGROUND OF THE INVENTION

1. Field of the Invention

This invention pertains to the field of electromagnetic power combining (either CW or pulsed), particularly at microwave frequencies, by means of coupled cavities containing power generating devices.

2. Description of the Prior Art

A prior art search uncovered the following references:

U.S. Pat. No. 3,628,171 illustrates early work done in the field of microwave power combining, wherein a single rectangular-cross-section cavity was employed with several diodes coupled to the cavity. The present invention utilizes more than one cavity, and in addition, preferably uses a cavity having a circular rather than rectangular cross-section.

U.S. Pat. Nos. 3,931,587 and 4,121,174 depict microwave cavity combiners having circular cross-sections. These cavities are of the general type used in the present invention. However, these patents do not illustrate the use of more than one cavity as in the present invention.

U.S. Pat. No. 4,147,994 discloses a power combiner for solid state oscillator circuits comprising a combination of a central cavity and several subcavities; coupled to the latter are several solid state oscillator circuits. All the subcavities are tuned to reasonate at the same frequency, unlike in the present invention where several mutually coupled cavities are intentionally tuned to operate at slightly offset natural frequencies. The present invention obtains a bandwidth improvement over this patent.

U.S. Pat. No. 4,175,257 discloses a modular microwave power combiner wherein each module comprises a central resonant cavity to which the power of several microwave diode amplifiers is coupled. The individual modular units are spaced apart by one half wavelength to allow parallel electrical coupling of all the resonant cavities. All of the individual modular units are tuned to operate at the same frequency, unlike in the present invention where the resonant frequencies of the individual cavities are intentionally offset. The present invention obtains a bandwidth improvement over this patent.

Proposal No. P-26189 for "GaAs IMPATT Diode Power Combining Techniques", Vol. 1 Technical, submitted by Ford Aerospace & Communications Corporation (the assignee of the instant invention) in response to RFP F33615-80-R-1015 to the United States Air Force Jan. 15, 1980, states on page 2–45 that outputs from two or more $TM_{010}$ cavities can be combined with potential for increased bandwidth with the proper choice of cavity-to-cavity coupling "as in a multisection bandpass filter". However, the reference does not disclose any of the following features of the present invention: the resonant frequencies of the individual cavities in the present invention are offset; the entire combination of cavities is injection locked; there is mutual coupling among all the cavities; the combiner is operated in a single mode, preferably the dominant mode (in fact, the reference discloses the opposite, i.e., the excitation of additional cavity modes).

Secondary references are U.S. Pat. Nos. 3,378,789; 3,582,813; 3,662,285; 3,733,560; 3,783,401; 3,873,934; 3,943,463; 3,962,654; 4,034,314; 4,075,578; 4,083,016; 4,090,152; 4,097,817; 4,143,334; 4,172,240; 4,188,590; and 4,189,684.

SUMMARY OF THE INVENTION

The present invention is a power combiner having at least two mutually-coupled electromagnetic cavities that are preferably right-circular-cylindrical in geometry. Displaced within each cavity is at least one power generating device, e.g., an IMPATT or Gunn diode, but the invention is not limited to such devices. The cavities are dimensioned to operate in a single $TM_{ONO}$ mode, where N is a positive integer; preferably N is equal to 1. The combiner is injection locked. The resonant (i.e., natural) frequencies of the individual cavities are intentionally slightly offset, so that at least two different natural frequencies are used. The combiner output frequency is varied by means of changing the frequency of the injecting oscillator.

When two or three cavities are employed, the injection locking bandwidth of the resulting combiner is increased compared with prior art multi-cavity combiners, which is an important advantage. In the prior art no attempt has been made to improve the bandwidth of combiners. For example, U.S. Pat. No. 4,147,994, which also describes a combiner consisting of a set of subcavities, employs a central combiner which is also of the $TM_{ONO}$ type. This patent specifically states that resonance of all cavities is at the same frequency, with the intent to optimize total power output. It follows that the bandwidth of the central combiner is comparable to that of each of the subcavities.

Although there is no inherent frequency limitation for the device of the present invention, physical size constraints make use below 1 GHz impractical. The greatest applicability is above 8 GHz.

BRIEF DESCRIPTION OF THE DRAWINGS

These and other more detailed and specific objects and features of the present invention are more fully disclosed in the following specification, reference being had to the accompanying drawings, in which.

DESCRIPTION OF THE PREFERRED EMBODIMENTS

Figure 1:
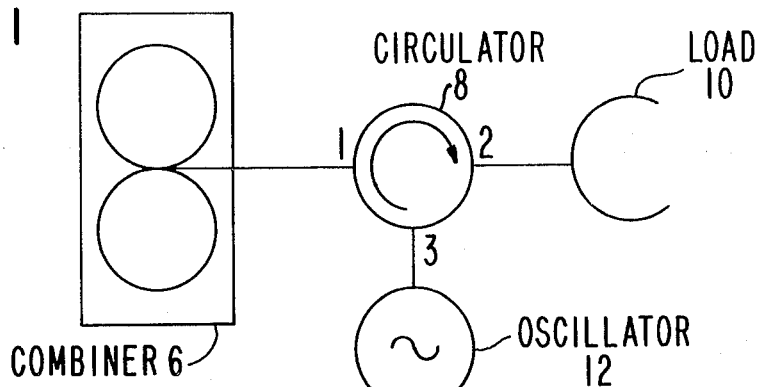
FIG. 1 is a schematic illustration of a technique for injection locking a power combiner of the present invention.

The present invention is a multi-cavity power combiner for electromagnetic energy wherein all the cavities are mutually coupled and injection locked. FIG. 1 illustrates a scheme for injection locking a typical combiner 6 of the present invention, which has two cylindrical cavities of circular cross-section. Combiner 6 as a free-running oscillator has a higher output power than the injecting oscillator 12, but usually has a noisier frequency spectrum than oscillator 12. The signal from oscillator 12 is normally derived by frequency multiplying a very stable low noise, low frequency reference source such as a crystal oscillator. Although this signal is amplified, the power level that can be obtained is limited. By using the injection locking process, combiner 6 is made to act as a high power, saturated amplifier. The frequency spectrum of combiner 6 is essentially equal to that of oscillator 12 within the injection locking bandwidth.

Item 8 is a nonreciprocal device. In the illustrated embodiment it is a three-port ferrite circulator. Electromagnetic energy can travel from port to port only in one direction, in this case the clockwise direction. Thus, energy from oscillator 12 travels through ports 3 and 1 of circular 8 then by a transmission line into combiner 6 where it injection locks combiner 6. The output energy from combiner 6 travels back out the transmission line, through ports 1 and 2 of circulator 8, into load 10, e.g., an antenna.

Figure 2:
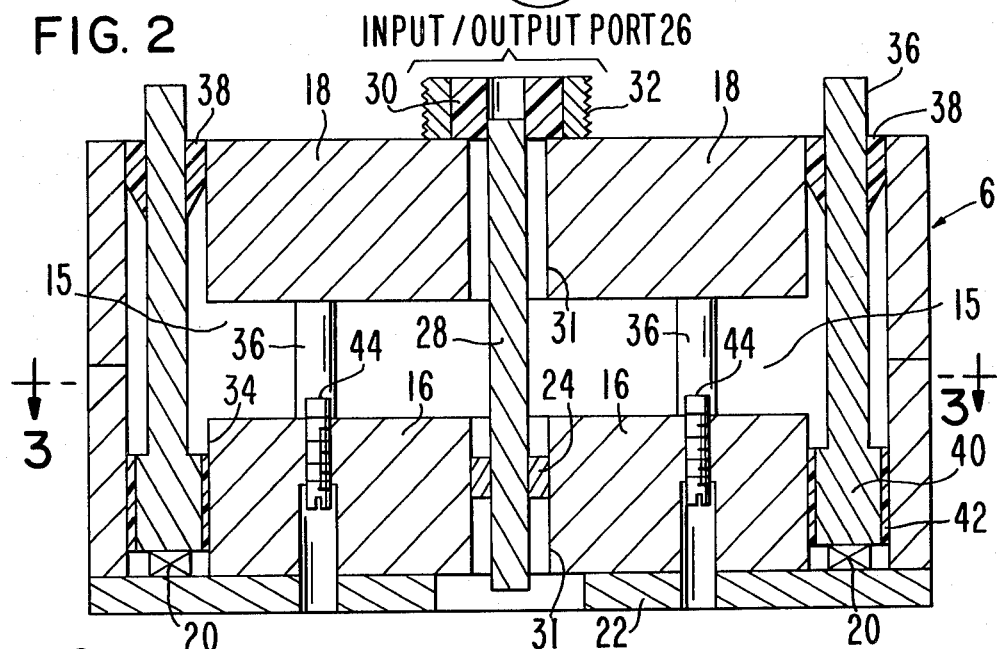
FIG. 2 is a cross-sectional side view of a combiner of the present invention from the class of embodiments having two cavities.

FIG. 2 illustrates a representative two-cavity embodiment of the present invention as used in an actual X-band model. Two cylindrical electromagnetic cavities 15 filled with dielectric (in this case, air), preferably having circular cross-sections and the same dimensions, are positioned tangent to each other so as to provide intercavity coupling. Additionally/alternatively, intercavity coupling can be enhanced/provided by having external transmission line connections between the cavities. An electrically highly conductive material is used for the surrounding structure consisting of upper plate 18, lower plate 16, and base plate 22. Plates 18 and 16 are usually aluminum and plate 22 is usually oxygen free copper. Each cavity is dimensioned to resonate in a single $TM_{ONO}$ mode, where N is a positive integer, preferably 1.

Each cavity 15 has a slightly different resonant frequency, as described in more detail below. Off-tuning the frequencies in this manner, combined with mutual intercavity coupling, increases the injection locking bandwidth, i.e., the bandwidth of combiner 6 compared to the case where both (all) cavities have the same resonant frequency. A simplified analytical treatment of this bandwidth improvement is given below.

The Figures illustrate the use of IMPATT diodes 20 as the active elements. However, other diodes can be used (Gunn, TRAPATT); the diodes could be replaced by any power generating devices that can be injection locked, such as klystron tubes, transistor (FET) oscillators, etc.

Base plate 22 serves as a ground for the anodes of each diode 20 and as a heat sink. The cathode of each diode 20 makes electrical contact with the center conductor (40) of a coaxial impedance matching transformer (40, 42, 34) positioned thereabove. Transformer (40, 42, 34) is dimensioned for maximum transfer (match) of the IMPATT diode (20) power to the cavity (15). The coaxial sleeve 42 around the transformer center conductor 40 is a low loss dielectric such as Rexolite. The sleeve 42 also serves as a mechanical support and centering device and isolates the center conductor electrically from the outer conductor so that bias can be applied to the diode (20).

The transformer center conductor (40) is extended by conductor 36 until it protrudes through the upper plate 18, where the electrical contacts to the bias supply are made. The conductor 36 is usually referred to as the bias line, but it also functions as a structure that couples power from 20 via the transformer to the cavity 15 when it traverses this cavity.

Within upper plate 18 the bias line 36 is RF terminated in a coaxial load 38 (in this case a tapered load) made from material such as Eccosorb MF-124, which acts as an RF choke.

A set of structures just described (40, 42, 34, 36 and 38), each serving one diode 20 is, for short, called a diode coaxial circuit. Several diode coaxial circuits are (preferably uniformly) spaced about the periphery of each cavity 15 except at the region of tangency of the cavities. The axis of 40, 36 is spaced one half of the diameter of 34 from the cylindrical wall of cavity 15. This increases the frequency bandwidth of the cavity compared to the common practice in the art to let the axis coincide with the cylindrical wall of the cavity 15. This is done at the cost of a lower maximum number of diodes that can be accommodated by a cavity, all else being equal.

Generally speaking, the greater the number of diodes 20, the greater power output obtained from the cavity. The practical limit for the number of diodes per cavity 15 is frequency dependent and is about sixteen for a circular cross-section cavity operating around 10 GHZ, less one or two devices at the region of tangency for a two-cavity combiner. The maximum number of diodes that can be combined in one cavity is determined by two constraints. The electrical constraint is the cavity bandwidth, which goes down as the ratio of the diameter of 34 to the diameter of cavity 15 goes down. The other constraint is the machining and mechanical tolerance and stability of the parts 40, 42, 34, 36, 38, which means that the higher the frequency the more difficult to realize the diode coaxial circuits and the more RF losses in them. There could be as little as one device 20 per cavity 15 and the bandwidth improvement of this invention would still be realized.

Input/output port 26 is generally a standard coaxial connector (metal housing with threads 32, dielectric supporting and alignment sleeve 30) with its major axis parallel to the major axis of each cavity 15. Port 26 is centered over the line of tangency of cavities 15. Port 26 carries the injecting signal into combiner 6 and conveys the output power from combiner 6 to load 10. Inner conductor 28 together with outer conductor 31 forms a coaxial transmission line in 18 and 16. The portion of 28 that traverses the tangency of cavities 15 provides the electromagnetic coupling between 26 and the cavities 15 via the coaxial transmission line (28, 31) in 18. The coaxial transmission line (28, 31) in 16 is terminated by coaxial sliding short 24. With the sliding short 24, the combiner 6 is tuned for maximum combiner efficiency which means maximum power transfer from the diodes 20 to the output port 26. In lieu of sliding short 24, an open circuit with a varying termination plane can be used for this purpose. The sleeve 24 is then a half wavelength dielectric sleeve, serving only as a mechanical support. The advantage is that there is no contact problem as with the sliding short. In either case, the function is to maximize the combiner efficiency.

Protruding from within lower plate 16 about the center axis of each cavity 15 is a screw 44. Screws 44 can be conductive or dielectric; they assist in fine tuning the frequency of combiner 6. The slight amounts of frequency offset necessary for proper functioning of this invention can be obtained solely from screws 44 rather than using different dimensions for each cavity 15.

Preferably, power generating devices 20 are as equal as possible both electrically and geometrically.

The diameter of each cavity 15 in inches is approximately equal to 9.05 divided by the desired center frequency in Gigahertz, for the case where N=1. The cylindrical height of each cavity 15 is not too critical. On the one hand, it is desirable to keep the height small to keep the Q of the cavity low (and hence the bandwidth broad). On the other hand, the coupling of diode 20 to cavity 15 depends on the length of 36 that traverses 15. There is therefore a lower limit to the height. In general, the size of each cavity 15 is a function of the desired frequency, the diameters of 31, 28, 34, and 36, and the total number of diodes 20.

Figure 4:
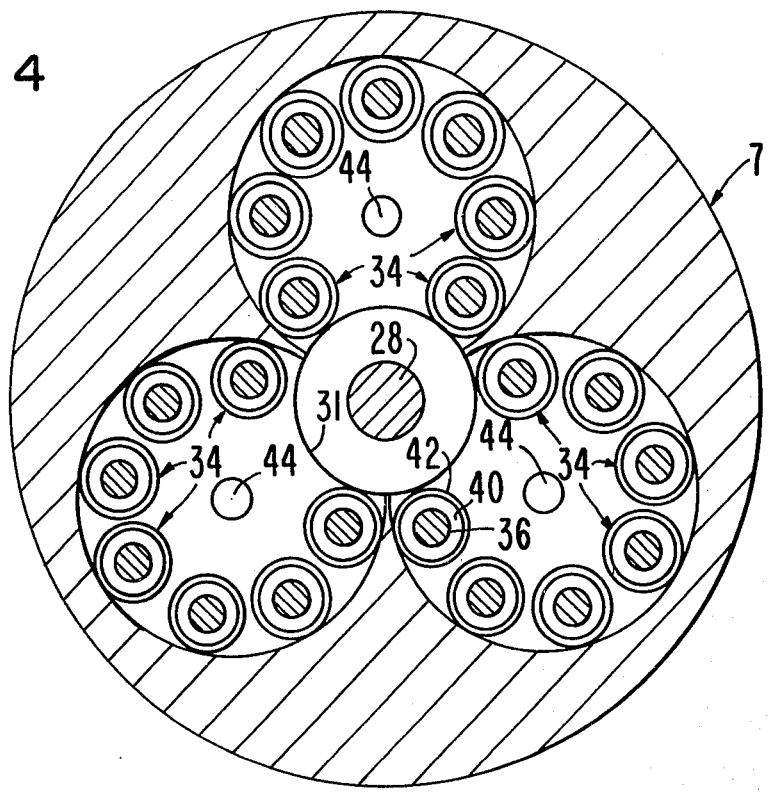
FIG. 4 is a cross-sectional top view of one embodiment of a three-cavity combiner following the teachings of the present invention.

FIG. 4 illustrates a combiner 7 representing an alternative embodiment of the present invention, wherein three $TM_{010}$ circular-cross-section cavities are combined, which allows for the use of a greater number of power generating devices. As before, the cavities are positioned so as to be tangent; this time, there are three lines of tangency.

Figure 5:
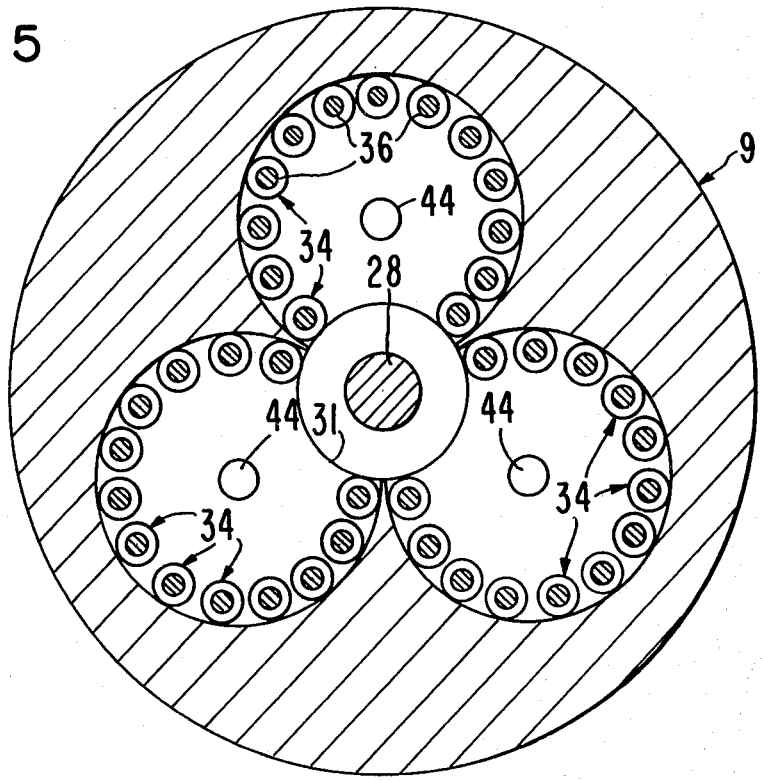
FIG. 5 is an alternative embodiment of a three-cavity combiner following the teachings of the present invention.

The coaxial outer conductor surface 31 as depicted in FIG. 4 contains these three lines of tangency. With the diameter of 28 chosen to make (28, 31) a 50 ohm coaxial transmission line (which may not be an optimum choice) and the cavities operating in the $TM_{010}$ mode, the coaxial (28, 31) line just begins to support the first higher order coaxial mode ($TM_{11}$). So, FIG. 4 and FIG. 5 show the largest diameter input/output intercavity coupling structure of the kind. The estimated intercavity coupling is 10 dB. This estimate is based on an extrapolation of an actual two-cavity combiner built around 10 GHz in accordance with FIGS. 2 and 3.

Figure 3:
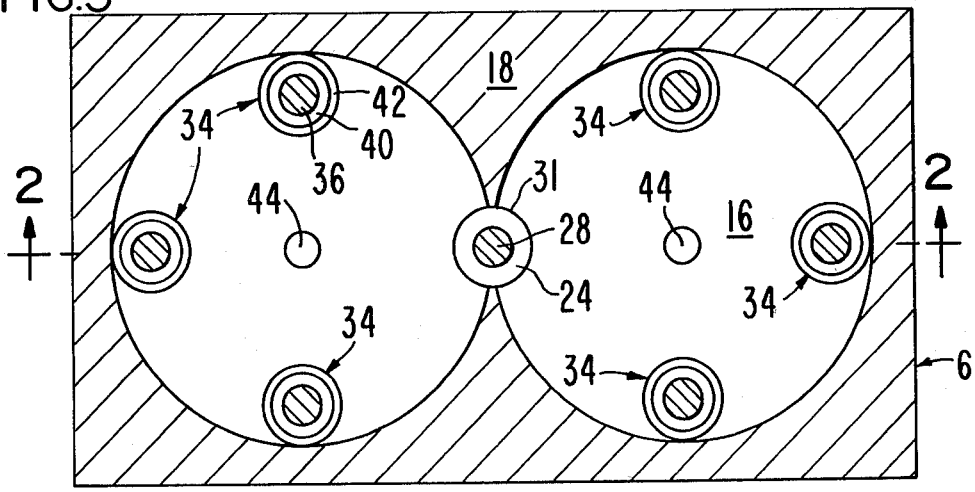
FIG. 3 is a cross-sectional top view of the combiner of FIG. 2 viewed along lines 3—3 thereof.

Once again, all of the power generating devices are uniformly spaced around the available periphery of each cavity and the positioning of the diode coaxial circuits with respect to the cavity are the same as shown in FIG. 2 and FIG. 3 of the two-cavity combiner.

There are 7 devices per cavity illustrated in FIG. 4. A combiner like this operating around 10 GHZ would require a diameter 34 of 7 mm, a standard coaxial outer conductor inner diameter size.

FIG. 5 shows an alternative embodiment of the present invention in which combiner 9 is configured as combiner 7, with the only difference that the diode coaxial circuits (34, 36) have half the size in combiner 9 compared to combiner 6. The 13 devices per cavity depicted are about the maximum practicable when this embodiment operates around 10 GHZ. The diameter 34 is then 3.5 mm, another standard coaxial size.

All three cavities are mutually and equally coupled in each of FIGS. 4 and 5. This serves to maximize the combined frequency pulling effectiveness of the combiner on the composite output power versus frequency curve.

In the three-cavity embodiments, the natural frequencies (the resonant frequencies) of the cavities are again slightly offset. At least two different natural frequencies must be used. Again, the result is an increase in injection locking bandwidth, as described in more detail below.

Although combiners can be constructed having greater than three cavities, using the same type of input-/output/intercavity coupling structure 28, 31 will result in a decrease in bandwidth compared to the two and three cavity combiner. The reason is that the intercavity coupling reduces since the cavities cannot be as closely packed, while the central coaxial dimensions (28, 31) remain the same (coaxial moding!). Other designs using external transmission lines for intercavity coupling can open up this bottleneck.

In all of the above embodiments, it is desirable to maximize the amount of intercavity coupling if one wishes to maximize the injection locking bandwidth. This can be accomplished by increasing the diameter of input/output/cavity coupling structure 28, 31. However, in order to prevent moding these dimensions have an upper limit. As mentioned earlier, FIGS. 4 and 5 define the largest diameter 31 that can be used for the geometry illustrated while retaining unimodal operation if the $TM_{010}$ cavity mode is used.

In all embodiments, all cavities are dimensioned for operation in a single $TM_{ONO}$ mode, where N is a positive integer. N is preferably equal to one. A cylindrical cavity 15 is preferable to a rectangular cross-section cavity because no intrinsic limitation is placed on the spacing between the diode coaxial circuits, only practical ones.

Figure 6:
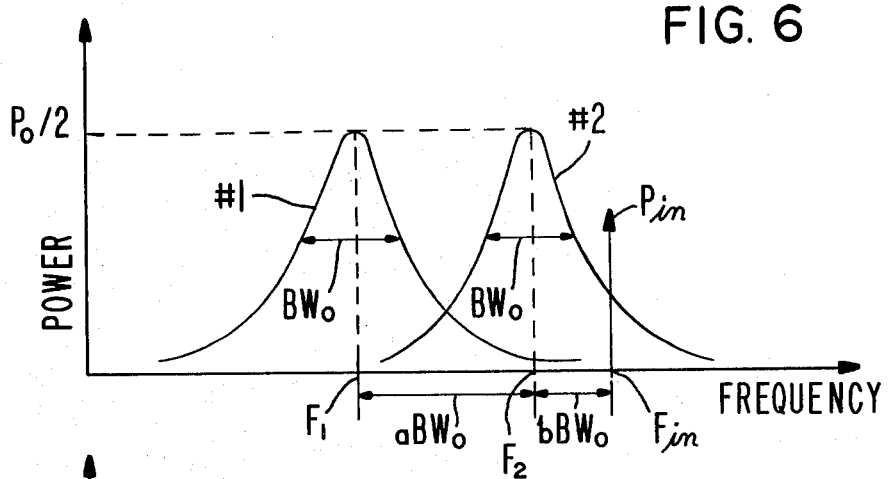
FIG. 6 is a graph of power versus frequency for the two cavities of a combiner of the present invention, when not excited simultaneously.
Figure 7:
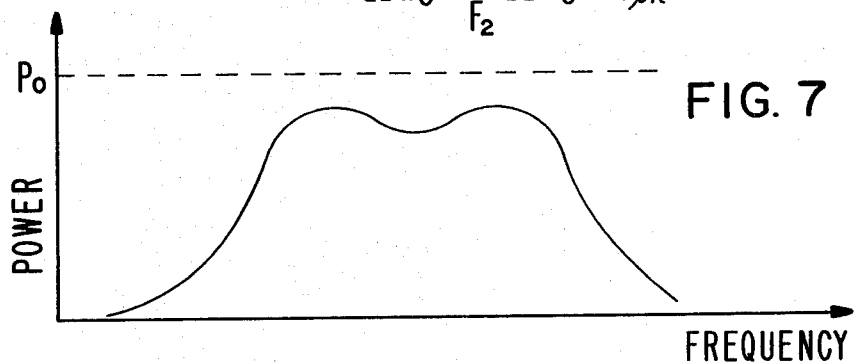
FIG. 7 is a graph of power versus frequency during excitation for a combiner consisting of the two cavities characterized in FIG. 6.

FIGS. 6 and 7 illustrate the operation of two-cavity, increased-bandwidth combiners of the present invention, such as combiner 6 illustrated in FIGS. 2 and 3. Cavity #1 and cavity #2 are identical and are operated so that when not excited simultaneously each has an output power of $P_0/2$, called the resonant power. Their resonant frequencies are slightly offset, as illustrated in FIG. 6. $F_1$ is the resonant frequency of cavity #1, $F_2$ is the resonant frequency of cavity #2, and $F_{in}$ is the frequency of oscillator 12. The bandwidth of each cavity is $BW_O$. (All bandwidths used herein are 3 dB bandwidths.)

The separation ($F_2-F_1$) is expressed in terms of $BW_0$ as $aBW_0$. The oscillator frequency $F_{in}$ is similarly expressed as $bBW_0$ higher than $F_2$. Because of the symmetry involved, $F_{in}$ could have been $bBW_0$ below $F_1$. It is the object to maximize the value of (a+2b), which is called the locking range. Within this range cavity #1 and cavity #2 are simultaneously phase locked to $F_{in}$. The locking range depends on the available input power ($P_{in}$) and the intercavity coupling. The maximum power that the combiner can supply is $2P_0/2=P_0$. The cavities then have the same resonant frequency (a=0) and there is no bandwidth improvement.

The injection locking ratio is defined as $K=P_{in}/P_0$ and the mutual injection locking ratio between cavities is defined as $C=P_{12}/P_2=P_{21}/P_1$ where $P_{12}$ is the power coupled from cavity #1 to cavity #2 (vice versa for $P_{21}$) and $P_i$ is the output power of cavity #i, i=1,2. To simplify the calculation and still show the potential bandwidth increase from this invention the following restriction is imposed: a is such that by internal coupling alone cavity #1 locks cavity #2 and vice versa. This restriction will result in a conservative value of a+2b (the locking range). It also means that the free-running combiner ($P_{in}=0$) is in an unstable equilibrium, which in practice means that the combiner output frequency is either $F_1$ or $F_2$ because one of the cavities will have a higher (however slight) resonant power than the other. This condition is the boundary between single and multiple frequency free-running combiner operation. Using the well known relation between input power, cavity bandwidth, and injection locking range of a single cavity oscillator, the following relations hold for a two-cavity combiner. Cavity output power as a function of frequency is:

$$P_i(F_i \pm aBW_0) = \tfrac{1}{2}P_0/(1+(2a)^2) \text{ for } i=1,2$$

$$P_{12} = P_{21} = C(\tfrac{1}{2}P_0)/(1+(2a)^2)$$

$$aBW_0 = BW_0(P_{12}/(\tfrac{1}{2}P_0))^{\tfrac{1}{2}}$$

From this follows the single frequency free-running condition: $a = \tfrac{1}{2}(-\tfrac{1}{2}+\tfrac{1}{2}(1+16C)^{\tfrac{1}{2}})^{\tfrac{1}{2}}$.

Similarly, an expression containing b can be derived for a given value of K: $(a+b)^2 = K + C/(1+(2b)^2)$.

The total injection locking bandwidth is $(a+2b)BW_0$. This is an improvement by a factor of $(a+2b)/K^{\tfrac{1}{2}}$ compared with a prior art injection locked combiner having two cavities resonant at the same frequency.

The power loss at the center frequency compared with said prior art combiner is $1/(1+a^2)$. The power loss at the locking band edges, compared with the peak power of said prior art combiner, is:

$$\tfrac{1}{2}(1/(1+(2b)^2) + 1/(1+(2(a+b))^2))$$

FIG. 7 illustrates the composite output power curve when the combiner is injection locked and operating according to the teachings of the present invention. The resulting signal has a wide bandwidth centered at the average of $F_1$ and $F_2$. The maximum power level is somewhat less than the $P_0$ available from prior art combiners that have both cavities operating at the same frequency, but in many applications this is acceptable in order to obtain the goal of increased bandwidth.

The following two examples illustrate the calculated expected performance of two-cavity combiners designed according to the principles described herein, based upon the above formulas. In the first example, $K = C = 0.1$ (as measured on a model built as shown in FIGS. 2 and 3). In the second example, $K = 0.1$ and $C = 0.25$. This latter value of C is the estimated maximum practicable coupling that can be achieved for a two-cavity combiner of the type illustrated herein, by enlarging (31, 28) until it almost can support the first higher coaxial mode ($TM_{11}$).

| Design Parameters | a | b | a + 2b | Bandwidth Improvement | Power Loss At Center | Power Loss At Band Edges |
|---|---|---|---|---|---|---|
| K = C = .1 | 0.28 | 0.16 | 0.60 | 1.875 | 0.33 dB | 1.74 dB |
| K = .1, C = .25 | 0.39 | 0.18 | 0.75 | 2.37 | 0.62 dB | 1.8 dB |

Figure 8:
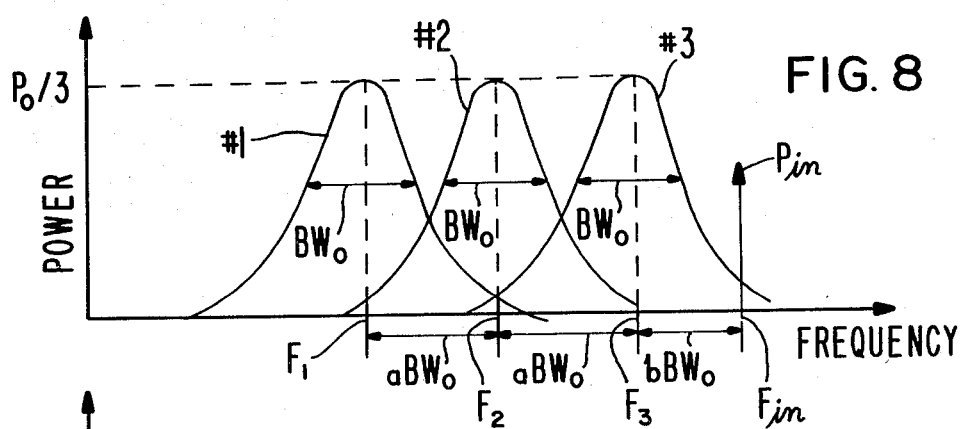
FIG. 8 is a graph of power versus frequency for the three cavities of a combiner of the present invention when not excited simultaneously.
Figure 9:
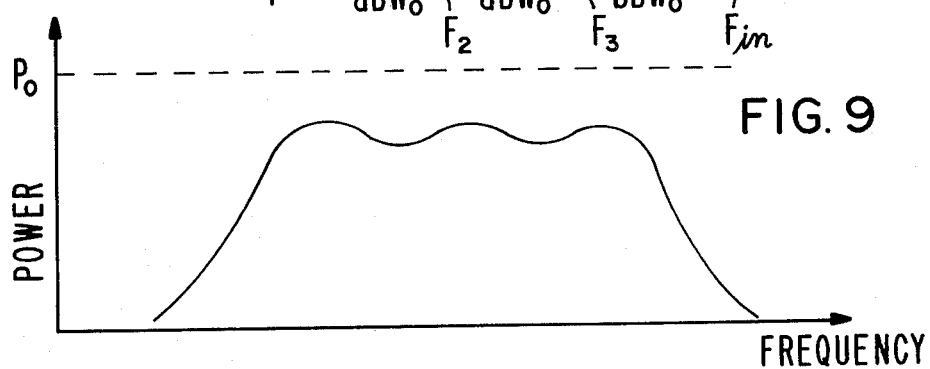
FIG. 9 is a graph of power versus frequency during excitation for a combiner consisting of the three cavities characterized in FIG. 8.

Corresponding power curves for a combiner of the present invention employing three identical cavities are given in FIGS. 8 and 9. Each cavity has a resonant power of $P_0/3$ with a bandwidth of $BW_0$. $F_n$ is the free-running frequency of cavity #n, n=1,2,3. The cavities with the lowest ($F_1$) and highest ($F_3$) resonant frequencies are separated by $2aBW_0$. The resonant frequency of cavity #2 is centered between $F_1$ and $F_2$. $F_{in}$ is again either $bBW_0$ below $F_1$ or $bBW_0$ above $F_3$.

Following a similar procedure as in the two-cavity case, the value of a in the three-cavity case is:

$$a = \tfrac{1}{2}(-(1-C)/2 + \tfrac{1}{2}((1-C)^2 + 8C)^{\tfrac{1}{2}})^{\tfrac{1}{2}}$$

The value of b is obtained by solving the equations:

$$(2a+b)^2 = K + C(1/(1+(2(a+b))^2) + 1/(1+(2b)^2))$$

For the three cavity case, the total locking bandwidth is $(2a+2b)BW_0$; this is an improvement by a factor of $(2a+2b)/K^{\tfrac{1}{2}}$ compared with the locking bandwidth of a three-cavity prior art injection locked combiner with all the cavities having the same resonant frequency.

The power loss at the center frequency, compared with said three-cavity prior art combiner, is:

$$(\tfrac{1}{3})(1 + 2/(1+(2a)^2))$$

The power loss at the locking band edges, compared with the peak power of said three-cavity prior art combiner, is:

$$(\tfrac{1}{3})(1/(1+(2(a+b))^2) + 1/(1+(2-(2a+b))^2) + 1/(1+(2b)^2))$$

The following two sets of tubular values, calculated from the above equations, illustrate the expected performance of three-cavity combiners designed according to the principles described herein.

In the first example, $K = C = 0.1$ (estimated maximum for combiner type illustrated); in the second, $K = 0.1$ and $C = 0.25$ (requires additional coupling of type not shown). C is assumed to be equal for all pairs of cavities because the cavities are assumed to be substantially identical.

| Design Parameters | a | b | 2a + 2b | Bandwidth Improvement | Power Loss At Center | Power Loss At Band Edges |
|---|---|---|---|---|---|---|
| K = C = .1 | 0.215 | 0.09 | 0.61 | 1.91 | 0.48 dB | 1.39 dB |
| K = .1, C = .25 | 0.326 | 0.06 | 0.77 | 2.4 | 0.96 dB | 1.9 dB |

The above description is included to illustrate the operation of the preferred embodiments, and does not limit the scope of the invention. The scope of the invention is to be limited only by the following claims. From the above discussion, many variations will be apparent to one skilled in the art that would yet be encompassed by the spirit and scope of the invention.

What is claimed is:

1. A power combiner comprising:
    at least two electromagnetic cavities, with mutual coupling among all cavities;
    disposed within each cavity, at least one electromagnetic power generating device; and
    a central structure, having a bandwidth greater than any of the cavities, and coupled to each of the cavities without the interposition, between the central structure and any of the cavities, of an intervening means having a bandwidth narrower than that of any of the cavities or central structure, said central structure disposed to convey combined electromagnetic power away from the cavities;

wherein said cavities are tuned to at least two different resonant frequencies falling within the passband of the central structure;

whereby said combined electromagnetic power can be injection locked over a broader frequency band than for a corresponding combiner in which the cavities are tuned to the same frequency.

2. The combiner of claim 1 wherein each pair of adjacent cavities has a common line of tangency.

3. The combiner of claim 2 wherein each of said power generating devices is coupled to a coupling line, said coupling lines being uniformly spaced around the periphery of each cavity, except that said coupling lines are not present in the vicinity of said lines of tangency.

4. The combiner of claim 1 wherein each of the cavities has substantially the shape of a right circular cylinder and is dimensioned to operate in the $TM_{010}$ mode.

5. The combiner of claim 1 wherein:
all cavities have substantially the same dimensions;
the number of power generating devices within each cavity is the same; and
each cavity has protruding therewithin means for fine tuning the resonant frequency of said cavity.

6. The combiner of claim 1 further comprising an injection locking oscillator coupled to said central structure through a nonreciprocal device; wherein
the difference between the maximum and minimum frequencies to which the cavities are tuned is sufficiently small to insure that the combiner is injection locked by said oscillator.

7. The combiner of claim 6 wherein the number of cavities is two;
the bandwidths and free running power outputs of said cavities are substantially equal; and
the injection locking bandwidth of the combiner is at least $(a+2b)$ times the bandwidth of each cavity, where $$a = \tfrac{1}{2}(-\tfrac{1}{2} + \tfrac{1}{2}(1+16C)^{\frac{1}{2}})^{\frac{1}{2}} \text{ and}$$

$$(a+b)^2 = K + C/(1+(2b)^2) \text{ where}$$

K is the injection locking ratio $P_{in}/P_o$, and C is the mutual injection locking ratio between cavities $P_{12}/P_2 = P_{21}/P_1$; where $P_o/2$ is the resonant power of each cavity;
$P_{in}$ is the input power supplied by the injection locking oscillator;

$P_{ij}$ is the power coupled from cavity i to cavity j for i,j = 1,2 and 2,1; and
$P_j$ is the output power of cavity $j = 1,2$.

8. The combiner of claim 1 further comprising an injection locking oscillator coupled to said central structure through a nonreciprocal device;
wherein the difference between the maximum and minimum frequencies to which the cavities are tuned is sufficiently small to insure that the combiner is frequency locked by said oscillator;
the number of cavities is three;
the bandwidths and free running power outputs of all cavities are substantially the same; and
the injection locking bandwidth of the combiner is at least $(2a+2b)$ times the bandwidth of each cavity, where $$a = \tfrac{1}{2}(-(1-C)/2 + \tfrac{1}{2}((1-C)^2 + 8C)^{\frac{1}{2}})^{\frac{1}{2}} \text{ and}$$

$$(2a+b)^2 = K + C(1/(1+(2(a+b))^2) + 1/(1+(2b)^2))$$
where

K is the injection locking ratio $P_{in}/P_o$, and C is the mutual injection locking ratio between cavities $P_{ij}/P_j = P_{ji}/P_i$; where $P_o/3$ is the resonant power of each cavity;
$P_{in}$ is the input power supplied by the injection locking oscillator;
$P_{ij}$ is the power coupled from cavity i to cavity j for i,j = 1,2, 1,3, and 2,3;
$P_j$ is the output power of cavity $j = 1,2,3$; and
$P_i$ is the output power of cavity $i = 1,2,3$.

9. The combiner of claim 8 wherein each of the three cavities has substantially the shape of a right circular cylinder and is dimensioned to operate in the $TM_{010}$ mode.

10. The combiner of claim 1 wherein the central structure comprises:
a substantially cylindrical elongated center conductor having upper, middle, and lower regions;
an upper outer conductor surrounding and spaced apart from the upper region; and
a lower outer conductor surrounding and spaced apart from the lower region; wherein
the cavities are formed intermediate the upper and lower conductors, and communicate directly with the middle region.

11. The combiner of claim 10 wherein the number of cavities is two, and the cavities have a common line of tangency coaxial with the center conductor.

* * * * *